(12) United States Patent
Kimura

(10) Patent No.: US 7,764,123 B2
(45) Date of Patent: Jul. 27, 2010

(54) RAIL TO RAIL BUFFER AMPLIFIER

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 38 days.

(21) Appl. No.: 12/325,273

(22) Filed: Dec. 1, 2008

(65) Prior Publication Data

US 2009/0153249 A1  Jun. 18, 2009

(30) Foreign Application Priority Data

Dec. 18, 2007  (JP) .............................. 2007-326329

(51) Int. Cl.
*H03F 3/18* (2006.01)
(52) U.S. Cl. ...................................... 330/264; 330/267
(58) Field of Classification Search ......... 330/262–265, 330/267
See application file for complete search history.

(56) References Cited

U.S. PATENT DOCUMENTS 4,833,424 A * 5/1989 Wright ........................ 330/267

6,268,769 B1 * 7/2001 Yamauchi et al. ............ 330/255
7,394,316 B1 * 7/2008 Alenin et al. ................ 330/267

FOREIGN PATENT DOCUMENTS

JP  2002-185269 A  6/2002
JP  2005-217949 A  8/2005

\* cited by examiner

*Primary Examiner*—Robert Pascal
*Assistant Examiner*—Hieu P Nguyen
(74) *Attorney, Agent, or Firm*—Charles Bergere

(57) ABSTRACT

A buffer amplifier having a wide output voltage range includes a first source follower circuit having a first current source and a first transistor, and a second source follower circuit having a second current source and a second transistor. The first source follower circuit has an output terminal connected to a gate of a third transistor and a source of a fourth transistor. The second source follower circuit has an output terminal connected to a gate of a fifth transistor and a source of a sixth transistor. First and second voltages are respectively supplied to the gates of the fourth and sixth transistors. The sixth transistor is operated in place of the fifth transistor in a low voltage range, and the fourth transistor is operated in place of the third transistor in a high voltage range.

8 Claims, 10 Drawing Sheets

FIG.5
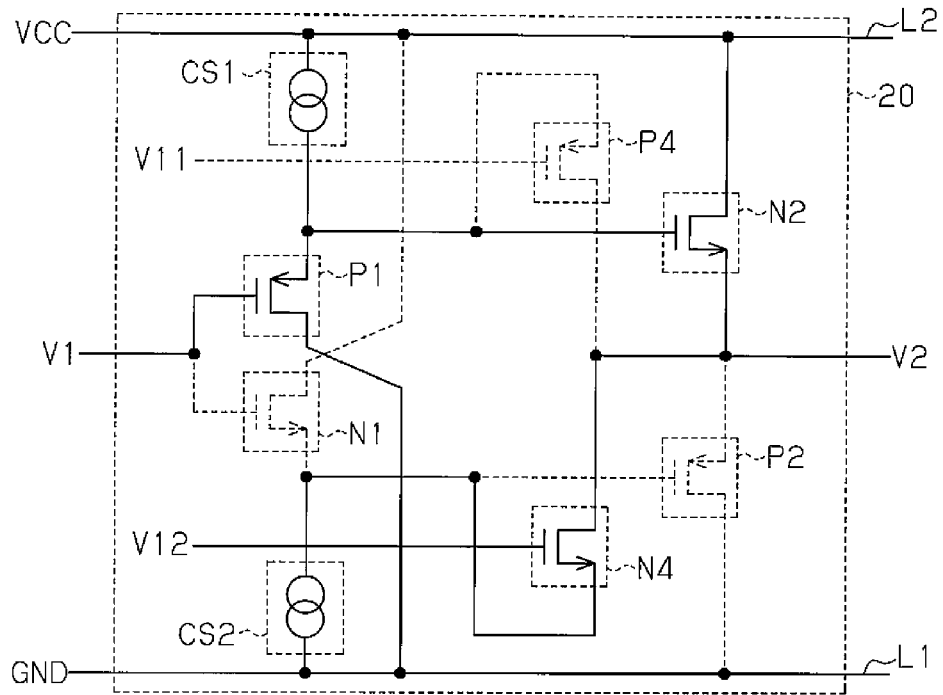
FIG.6A
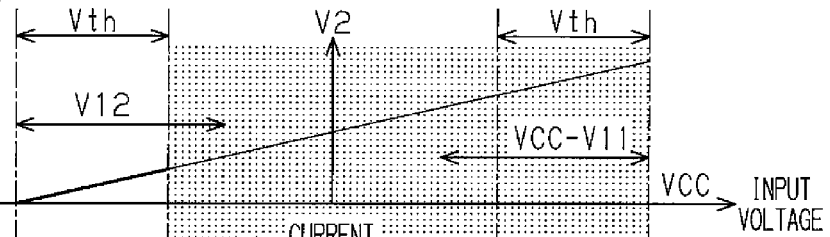
FIG.6B
FIG.6C
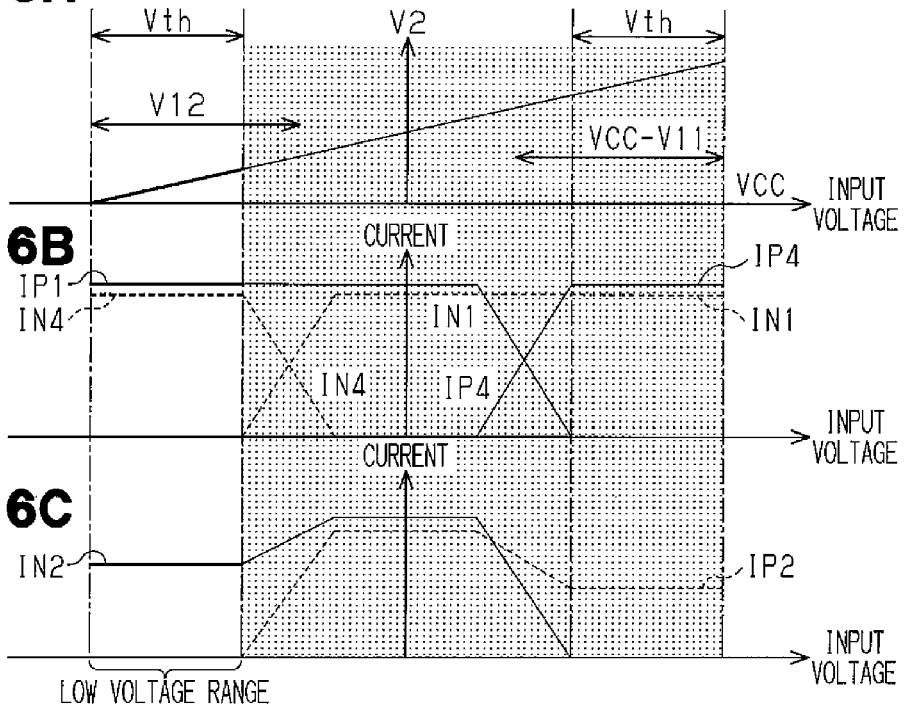

RAIL TO RAIL BUFFER AMPLIFIER

BACKGROUND OF THE INVENTION

The present invention relates to a buffer amplifier that generates an output voltage in accordance with an input voltage, and more particularly, to an amplifier circuit having a wide output voltage range.

In the prior art, a buffer amplifier that outputs an output signal amplified at a gain of one time is used in accordance with the provided input signal. When an operational amplifier is used as the buffer amplifier, feedback is necessary. Thus, the circuit becomes more complicated. To solve this problem, the use of a driver circuit having low power consumption and high voltage accuracy has been discussed (refer, for example, to Japanese Laid-Open Patent Publication No. 2005-217949, FIG. 3). Such a driver circuit includes a voltage generation unit for generating a basic output voltage that is in accordance with an input voltage, a first buffer circuit for outputting an output voltage in accordance with the basic output voltage output from the voltage generation unit, and a second buffer circuit for generating a voltage in accordance with the output voltage. The second buffer circuit consumes more power than the first buffer circuit. The driver circuit further includes a quasi-buffer circuit having substantially the same properties as the first buffer circuit. The quasi-buffer circuit generates a quasi-voltage in accordance with the basic output voltage provided by the voltage generation unit. The basic output voltage is controlled based on the simulation voltage.

There has also been discussion of a buffer amplifier having an output voltage range that can be widened (refer, for example, to Japanese Laid-Open Patent Publication No. 2002-185269, FIG. 1). Such a buffer amplifier includes an n-channel source follower circuit and a p-channel source follower circuit, each of which receives an input voltage. The buffer amplifier further includes an output stage circuit connected to the outputs of the two source follower circuits to generate an output voltage. A first current mirror circuit supplies an output current to the output of the output stage circuit using the output current of the n-channel source follower circuit as an input current. A second current mirror circuit supplies an output current to the output of the output stage circuit using the output current of the p-channel source follower circuit as an input current.

However, the output voltage range (swing) is not sufficient for the following reasons. Referring to FIG. 14, a schematic diagram of the driver circuit disclosed in Japanese Laid-Open Patent Publication No. 2005-217949 is shown. In this driver circuit, an output of a pulse generator 500 is amplified by a first buffer circuit 510 and a second buffer circuit 520. In this circuit, however, the output voltage of the second buffer circuit 520 is restricted by the base-emitter voltage of a transistor 531 when the input voltage is in a high range and restricted by a transistor 532 when the input voltage is low.

FIG. 15 is a schematic circuit diagram of a buffer amplifier of Japanese Laid-Open Patent Publication No. 2002-185269. The buffer amplifier includes current mirror circuits 640 and 650 to widen or increase the swing. The current mirror circuits 640 and 650, respectively, include transistors 641 and 642 and transistors 651 and 652 to generate output voltages in a range in which source follower circuits 610 and 620 do not function.

In order to operate the transistor 641, however, the drain voltage of the transistor 611 must be decreased as much as possible. When the input voltage becomes high and approaches the power supply voltage, the drain voltage of the transistor 611 also becomes high. Thus, the transistor 641 cannot be sufficiently driven.

In this case, the drive capacity of the current mirror circuit 640 can be ensured by increasing the threshold voltage of the transistor 611. However, this would lower the operational speed since the source-drain voltage of the transistor 611 is small. Such a problem also arises with the source follower circuit 620 and the current mirror circuit 650 when the input voltage is low.

BRIEF DESCRIPTION OF THE DRAWINGS

FIGS. 4A to 4C are charts showing voltage characteristics of the buffer amplifier in the intermediate voltage range, in which FIG. 4A shows the output voltage, FIG. 4B shows the current flowing through transistors P1, N1, P4, and N4, and FIG. 4C shows the current flowing through transistors P2 and N2;

FIG. 5 is a circuit diagram showing the operation of the buffer amplifier in a low voltage range;

FIGS. 6A to 6C are charts showing voltage characteristics of the buffer amplifier in the low voltage range, in which FIG. 6A shows the output voltage, FIG. 6B shows the current flowing through the transistors P1, N1, P4, and N4, and FIG. 6C shows the current flowing through the transistors P2 and N2;

FIGS. 8A to 8C are charts showing voltage characteristics of the buffer amplifier in the high voltage range, in which FIG. 8A shows the output voltage, FIG. 8B shows the current flowing through the transistors P1, N1, P4, and N4, and FIG. 8C shows the current flowing through the transistors P2 and N2;

FIGS. 10A to 10D are charts showing frequency characteristics of a series regulator, in which FIG. 10A shows the gain of a circuit in the prior art, FIG. 10B shows the phase of the circuit in the prior art, FIG. 10C shows the gain of a circuit in the preferred embodiment, and FIG. 10D shows the phase of the circuit in the preferred embodiment;

FIGS. 11A to 11D are charts showing input voltage characteristics of a series regulator, in which FIG. 11A shows the output voltage of a circuit in the prior art, FIG. 11B shows the output current of the circuit in the prior art, FIG. 11C shows the output voltage of a circuit in the preferred embodiment, and FIG. 11D shows the output current of the circuit in the preferred embodiment;

DETAILED DESCRIPTION OF THE PREFERRED EMBODIMENTS

The present invention provides a buffer amplifier having a wide output voltage range.

In one embodiment, the present invention provides an amplifier circuit including first and second source follower circuits supplied with an input voltage. A first output transistor includes a control terminal, which is provided with an output of the first source follower circuit, and a first terminal, which is supplied with a power supply voltage. A second output transistor includes a control terminal, which is provided with an output of the second source follower circuit, and a first terminal, which is supplied with a base voltage. A first auxiliary transistor includes a second terminal, which is connected to an output terminal of the first source follower circuit, and a control terminal, which receives a first bias voltage. A second auxiliary transistor includes a second terminal, which is connected to an output terminal of the second source follower circuit, and a control terminal, which receives a second bias voltage. An output means outputs a voltage at a connection node of second terminals of the first and second output transistors and first terminals of the first and second auxiliary transistors.

A buffer amplifier according to the present invention will be discussed with reference to FIGS. 1 to 11. In one embodiment of the present invention, the buffer amplifier includes first and second auxiliary transistors. The first auxiliary transistor operates when the input voltage is close to the power supply voltage, and the second auxiliary transistor operates when the input voltage is close to ground potential. In one embodiment, the buffer amplifier is formed by a field-effect transistor element, the gate terminal, drain terminal, and source terminal of which respectively function as a control terminal, a first terminal, and a second terminal.

Figure 1:
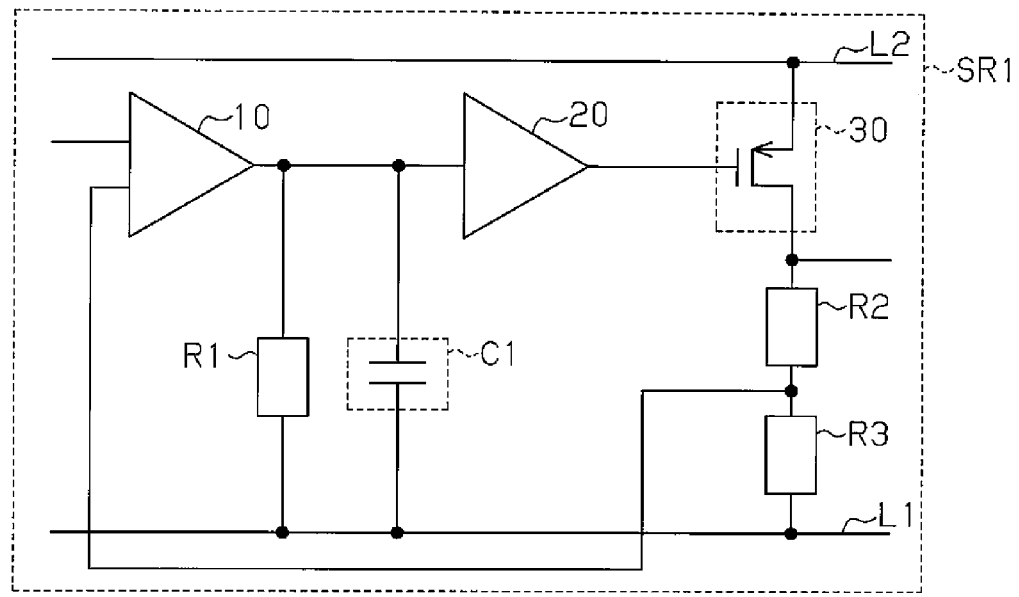
FIG. 1 is a circuit diagram of a series regulator according to a preferred embodiment of the present invention.

Referring now to FIG. 1, the buffer amplifier of one embodiment of the present invention is applied to a series regulator SR1. The series regulator SR1 includes an amplifier 10, a resistor R1, a capacitor C1, a buffer amplifier 20, a resistor R2, and a resistor R3.

The amplifier 10 receives an input signal of the series regulator SR1. The output of the amplifier 10 is provided to the buffer amplifier 20. The resistor R1 and the capacitor C1 are arranged between the output terminal of the amplifier 10 and a ground line L1.

The output of the buffer amplifier 20 is provided to the gate terminal of an output transistor 30. The output transistor 30 is formed by a field-effect transistor element having a p-channel type (first conductivity type) MOS structure. The source terminal of the output transistor 30 is connected to a power supply line L2. The drain terminal of the output transistor 30 is connected to the ground line L1 via the resistors R2 and R3. The voltage at the drain terminal of the output transistor 30 is the output voltage. This output voltage is divided by the resistors R2 and R3 and fed back to the amplifier 10.

Figure 2:
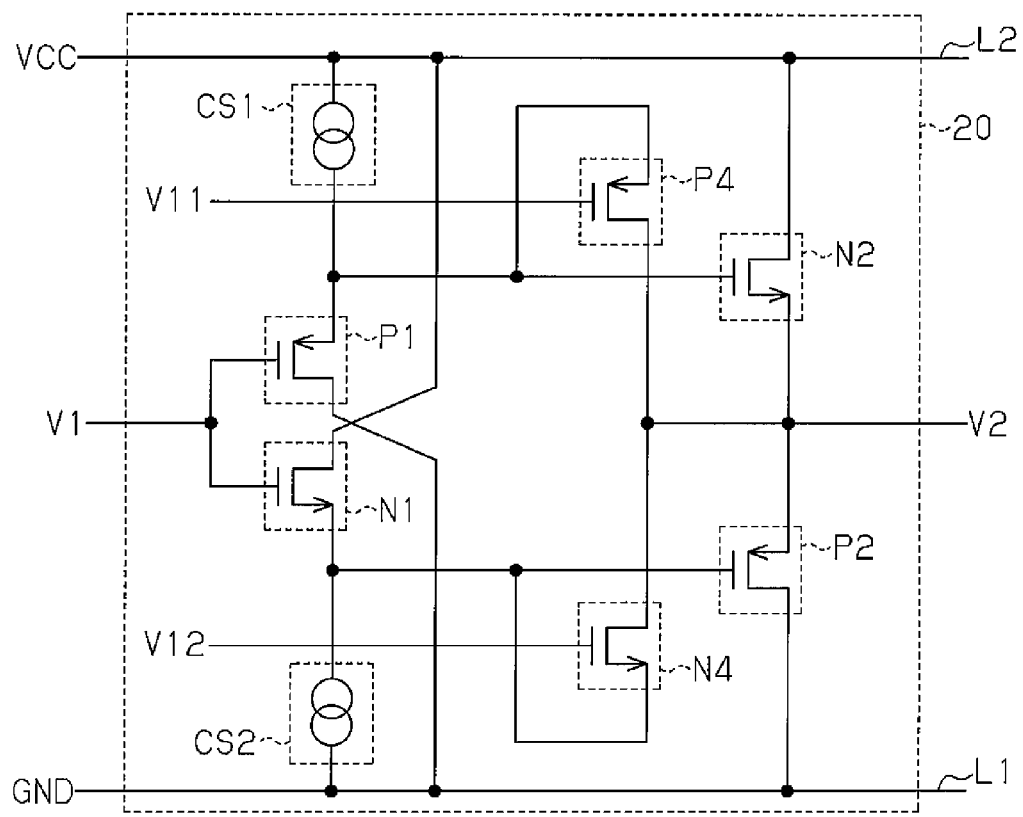
FIG. 2 is a circuit diagram of a buffer amplifier shown in FIG. 1.

The configuration of the buffer amplifier 20 will now be described with reference to FIG. 2. The buffer amplifier 20 is connected to the power supply line L2, which is supplied with power supply voltage, and a ground line L1, which is supplied with a base voltage. The buffer amplifier 20 includes an input terminal supplied with a voltage V1 and an output terminal for outputting a voltage V2.

The input terminal of the buffer amplifier 20 is connected to the gate terminals of transistors P1 and N1, which are thus supplied with the voltage V1. The transistor P1 is formed by a transistor element (first transistor), which has a p-channel type (first conductivity type) MOS structure, and the transistor N1 is formed by a transistor element (second transistor), which has an n-channel type (second conductivity type) MOS structure.

The source terminal of the transistor P1 is supplied with current from a current source CS1 (first current source), which is connected to the power supply line L2 for receiving the power supply voltage VCC. The drain terminal of the transistor P1 is connected to the ground line L1. The current source CS1 and the transistor P1 form a first source follower circuit.

The drain terminal of the transistor N1 is connected to the power supply line L2. The source terminal of the transistor N1 is connected to the ground line L1 via a second current source CS2. The second current source CS2 and the transistor N1 form a second source follower circuit.

A connection node of the current source CS1 and the transistor P1 (i.e., the output terminal of the first source follower circuit) is connected to the gate terminal of a transistor N2 and the source terminal of a transistor P4. A connection node of the current source CS2 and the transistor N1 (i.e., the output terminal of the second source follower circuit) is connected to a gate terminal of a transistor P2 and a source terminal of a transistor N4. The transistors N2 and N4 are transistor elements each having an n-channel type MOS structure, and the transistors P2 and P4 are transistor elements having a p-channel type MOS structure.

The transistor N2 functions as a first output transistor, the drain terminal of which is connected to the power supply line L2. The source terminal of the transistor N2 is connected to the source terminal of the transistor P2. The transistor P2 functions as a second output transistor, the drain terminal of which is connected to the ground line L1.

The transistor P4 functions as the first auxiliary transistor, the gate terminal of which is supplied with voltage V11 serving as a first bias voltage. The transistor N4 functions as the second auxiliary transistor, the gate terminal of which is supplied with voltage V12 serving as a second bias voltage. The voltage V11 is set based on a value obtained by subtracting the threshold voltage of the transistor P1 from the power supply voltage. More specifically, a threshold voltage Vth is subtracted from the power supply voltage VCC, and a value that is less than the obtained difference by a predetermined value is set as the voltage V11. Further, the voltage V12 is set based on a value obtained by adding the threshold voltage of the transistor N1 to the base voltage. More specifically, a value that is greater by a predetermined value than the threshold voltage Vth is set as the voltage V12.

The drain terminal of the transistor P4 and the drain terminal of the transistor N4 are connected to each other. The output terminal of the buffer amplifier 20 (output means) is connected to a connection node of the transistors N4 and P4 and to a connection node of the transistors P2 and N2.

The operation of the buffer amplifier 20 for an intermediate voltage range, low voltage range, and high voltage range will now be discussed with reference to FIGS. 3 to 8.

[Intermediate Voltage Range]

Figure 3:
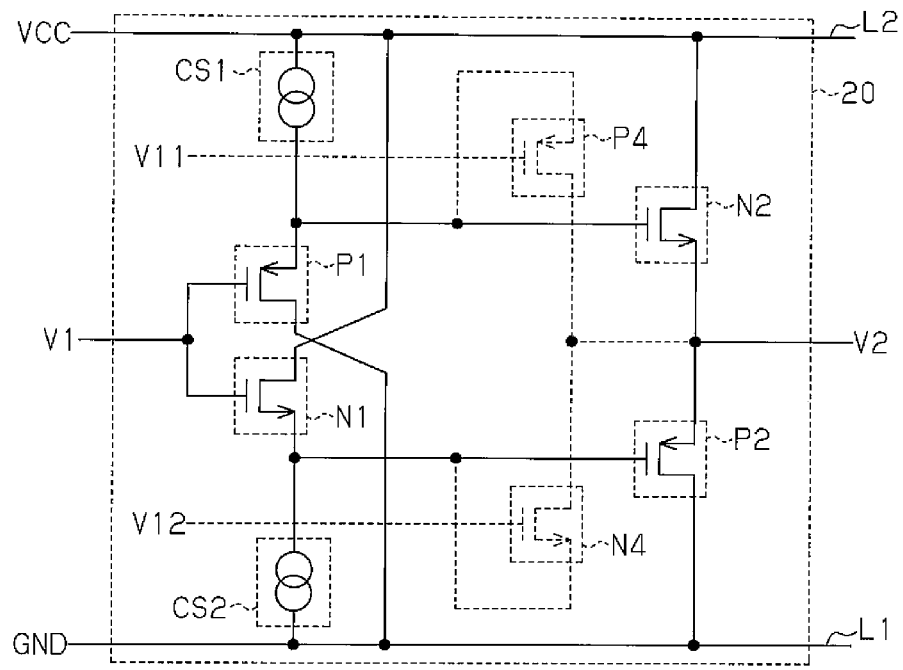
FIG. 3 is a circuit diagram illustrating the operation of the buffer amplifier in an intermediate voltage range.

First, with reference to FIGS. 3 and 4, the operation of the buffer amplifier 20 when the voltage V1 is in the intermediate voltage range (range of threshold voltage Vth to voltage [VCC−Vth]) will be discussed.

Figure 4A:
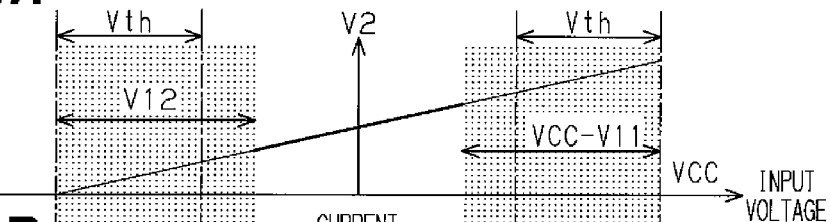
Figure 4B:
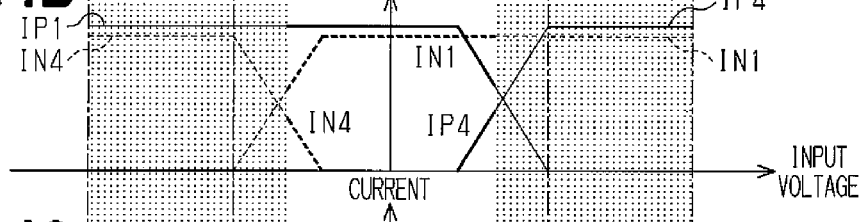
Figure 4C:
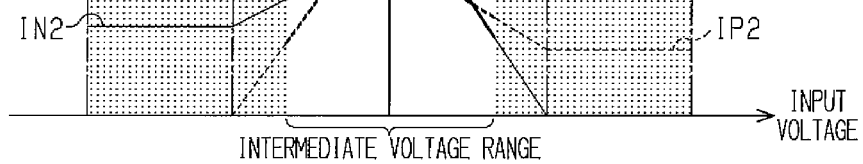

In this case, the transistors P1 and N1 are activated so that currents IP1 and IN1 flow, as shown in FIG. 4B. Referring to FIG. 3, the gate-source voltage of the transistors P4 and N4 is small. Thus, the transistors P4 and N4 are deactivated and currents IP4 and IN4 become "0". Currents IP2 and IN2, which are shown in FIG. 4C, flow to the transistors P2 and N2.

Such a circuit is referred to as a diamond buffer circuit. This circuit is formed by the first source follower circuit, which includes the transistor P1 and the current source CS1, and the second source follower circuit, which includes the transistor N1 and the current source CS2. The transistors N2 and P2 are driven by the output of each source follower circuit, and the voltage V2 (voltage V1) is output, as shown in FIG. 4A.

[Low Voltage Range]

With reference to FIGS. 5 and 6, the operation of the buffer amplifier 20 when the input voltage is in the low voltage range (range of ground voltage to threshold voltage Vth) will be discussed.

When the voltage V1 input to the buffer amplifier 20 becomes low, the gate terminal voltage of the transistor N1 approaches the ground voltage GND. When the difference between the voltage V1 and the ground voltage GND becomes less than or equal to the threshold voltage Vth of the transistor N1, the transistor P1 remains activated but the transistor N1 is deactivated, as shown in FIG. 5. In this case, the transistor P4 remains deactivated. However, the current I2 is supplied from the source terminal of the transistor N4 to the current source CS2. This lowers the voltage at the source terminal of the transistor N4. The transistor N4 is activated when the gate-source voltage of the transistor N4 becomes greater than the threshold voltage Vth.

As a result, the transistor N4 operates in place of the transistor P2, and the current IN4 flows as shown in FIG. 6B. The amount of current IN4 is the same as the current I2 of the current source CS2. The switching to the transistor N4 is quickly performed by setting the voltage V12 supplied to the transistor N4 at a high value.

When there is no input or output of current from the output terminal, the transistor N2, the transistor N4, and the current source CS2 function as a source follower circuit, and the current IN2 flows to the transistor N2 as shown in FIG. 6C. The source follower circuit is driven by the outputs of the transistor P1 and the current source CS1, and the voltage V2, which is in accordance with the voltage V1, is output as shown in FIG. 6A.

[High Voltage Range]

Figure 7:
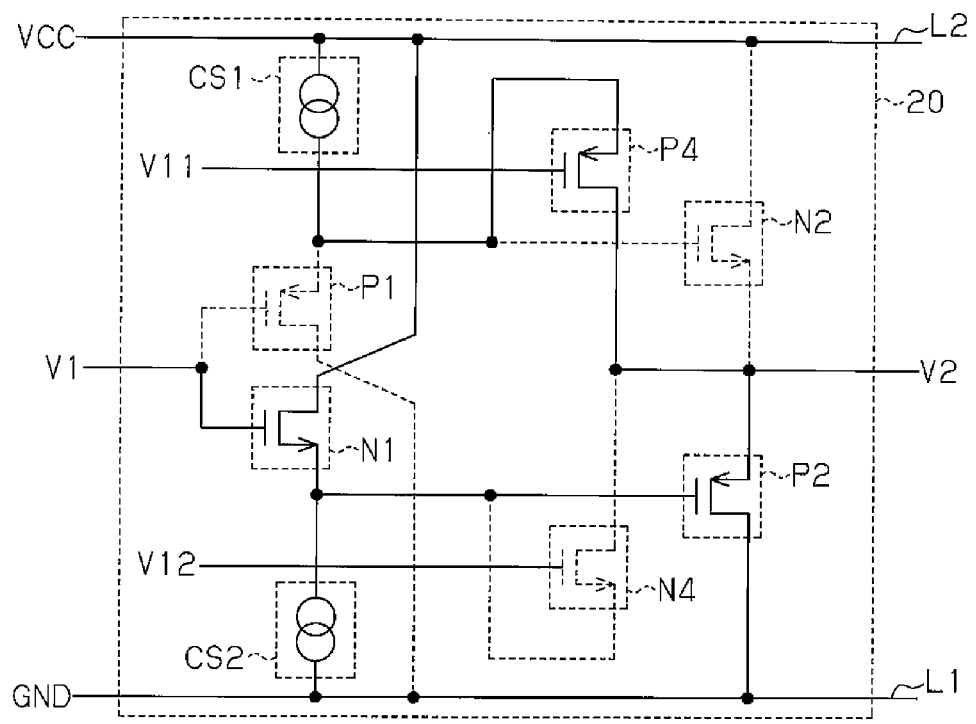
FIG. 7 is a circuit diagram showing the operation of the buffer amplifier in a high voltage range.

With reference to FIGS. 7 and 8, the operation of the buffer amplifier 20 when the input voltage is in the high voltage range (range of voltage [VCC-Vth] to power supply voltage VCC) will be discussed.

When the voltage V1 input to the buffer amplifier 20 becomes high, the gate terminal voltage of the transistor P1 approaches the power supply voltage VCC. When the difference between the voltage V1 and the power supply voltage VCC becomes less than or equal to the threshold voltage Vth of the transistor P1, the transistor N1 remains activated. However, the transistor P1 is deactivated, as shown in FIG. 7. In this case, the transistor N4 remains deactivated. However, the current I1 of the current source CS1 is supplied to the source terminal of the transistor P4. This increases the voltage at the source terminal of the transistor P4. The transistor P4 is activated when the gate-source voltage of the transistor P4 becomes greater than the threshold voltage Vth.

Figure 8A:
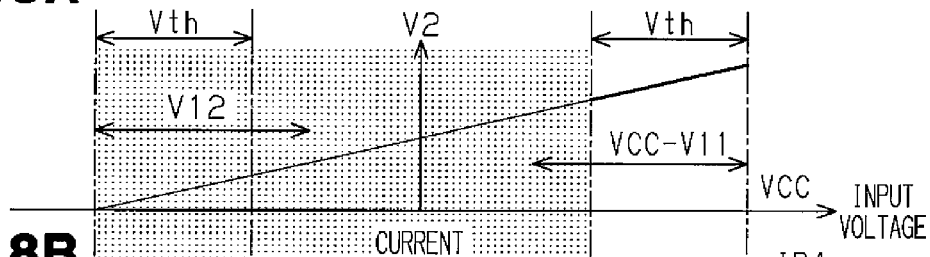
Figure 8B:
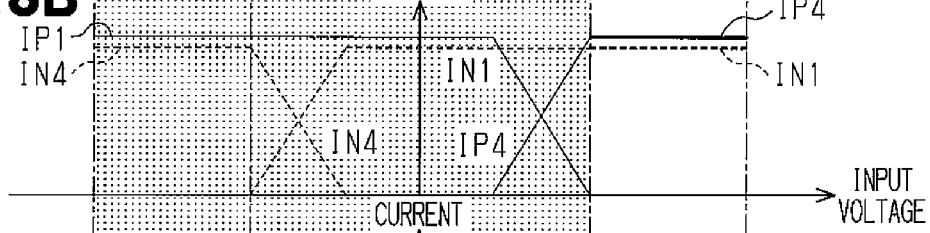

As a result, the transistor P4 then operates in place of the transistor N2, and the current IP4 flows as shown in FIG. 8B. The current IP4 is the same as the current I1 of the current source CS1. The switching of the transistor P4 is quickly performed by setting the voltage V11 supplied to the transistor P4 at a low value.

Figure 8C:
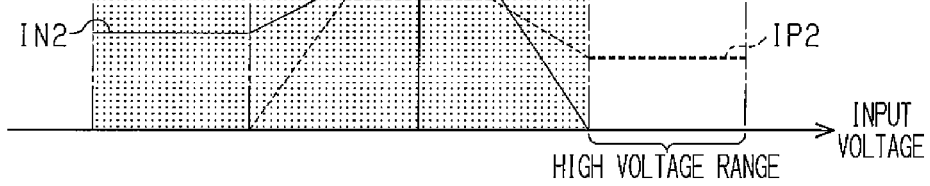

When there is no input or output of current from the output terminal, the transistor P2, the transistor P4, and the current source CS1 function as a source follower circuit, and the current IP2 flows to the transistor P2 as shown in FIG. 8C. The source follower circuit is driven by the outputs of the transistor N1 and the current source CS2, and the voltage V2 corresponding to the voltage V1 is output, as shown in FIG. 8A.

[Operation of Series Regulator]

The buffer amplifier 20 is used in the series regulator SR1 as shown in FIG. 1. In this case, the output transistor 30 occupies a large area in the series regulator SR1. Thus, even if the output current of the series regulator SR1 is "0", the output voltage of the buffer amplifier 20 must rise to the vicinity of the power supply voltage. Otherwise, the output transistor 30 will not be sufficiently deactivated and thereby produce leakage current. Such leakage current may increase the output voltage. In order to reduce the influence of such leakage current, the resistance values of the resistors R2 and R3 must be decreased or a bleeder resistor must be added to the output. This would, however, increase current consumption.

If the output voltage of the buffer amplifier 20 is brought close to the ground voltage GND, current would easily flow to the output transistor 30. Therefore, a smaller output transistor 30 can be used to obtain the same output current. When the same output transistor 30 is used, a larger output current can be obtained.

To this end, it is preferable that the swing of the output of the buffer amplifier 20 be as large as possible between the ground voltage GND and the power supply voltage VCC.

Figure 9:
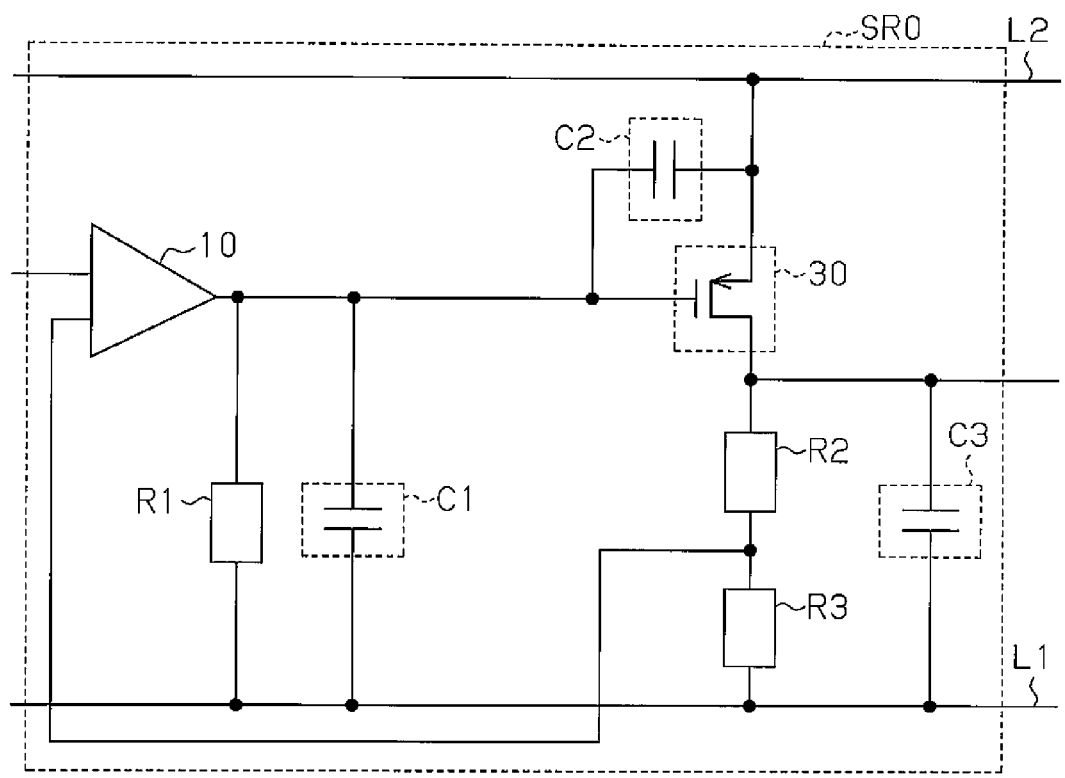
FIG. 9 is a circuit diagram of a prior art series regulator.
Figure 10A:
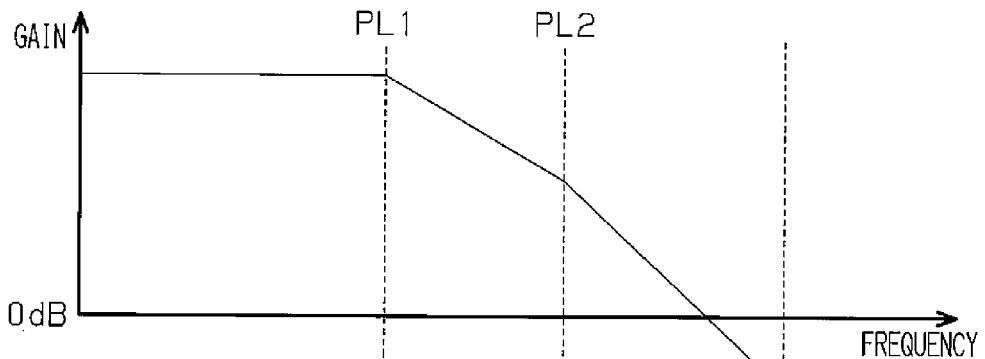

With reference to FIG. 9, a series regulator SR0 that does not include the buffer amplifier 20 will be described to demonstrate the effect of the buffer amplifier 20. If the output transistor 30 was large, a large capacitor C2 would exist between the source and gate terminals of the output transistor 30. When operating such a series regulator SR0, as shown in FIG. 10A, in the gain-frequency characteristics, a pole PL1 is generated by the output capacitor C3 and a pole PL2 is generated by the capacitor C2. The capacitor C1 is much smaller than the capacitor C2. Thus, the capacitor C1 does not influence the pole PL2.

Figure 10B:
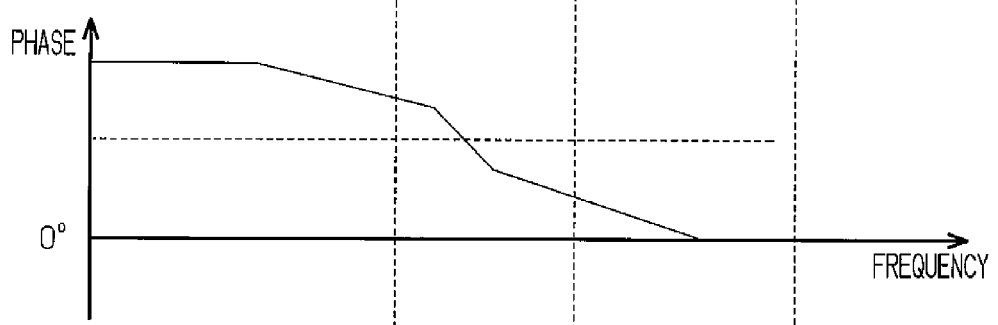

If the two poles PL1 and PL2 are close, a phase margin (phase when the gain is 0 dB) cannot be sufficiently ensured in the phase frequency characteristics shown in FIG. 10B. Therefore, it is preferable that the two poles PL1 and PL2 be sufficiently spaced apart to ensure the phase margin and stably operate the series regulator.

Figure 10C:
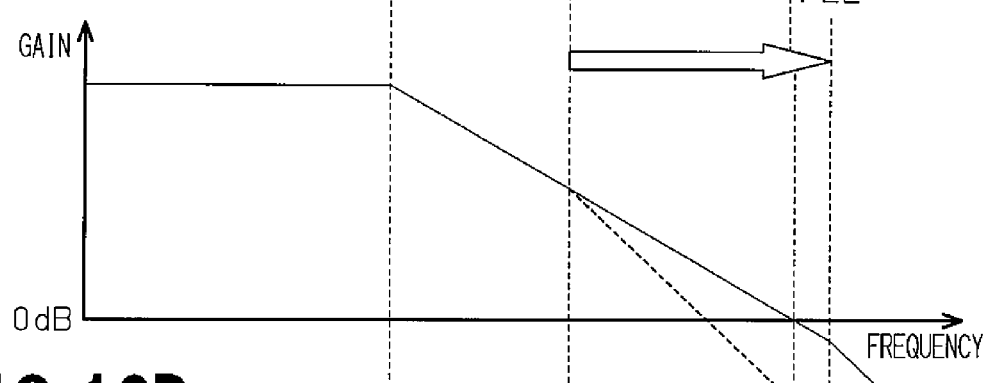
Figure 10D:
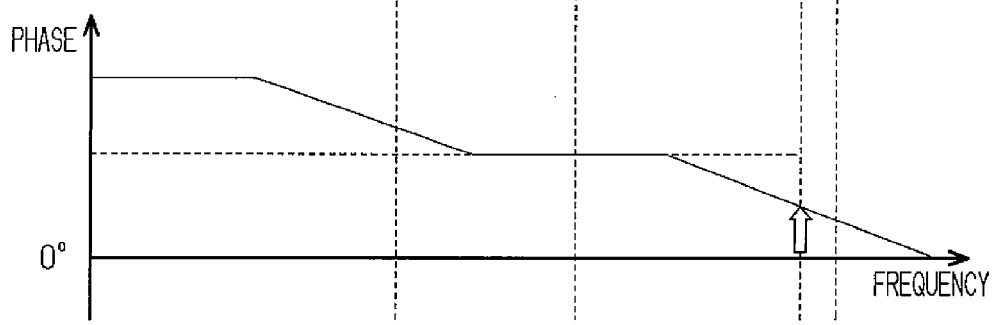

Insertion of the buffer amplifier 20 disconnects the two capacitors C1 and C2. If the buffer amplifier 20 can sufficiently drive the capacitor C2, the pole generated by the capacitor C2 moves to a higher frequency range. The pole generated by the resistor R1 and the capacitor C1 at the input of the buffer amplifier 20 also exists in a higher frequency range than the pole PL1. Thus, the pole PL2 generated at the input or the output of the buffer amplifier 20 moves to a higher frequency than the pole PL1. As a result, the two poles PL1 and PL2 can be separated and the gain can be maintained at a high frequency, as shown in FIG. 10C. The phase margin can also be ensured, as shown in FIG. 10D.

The amplifier circuit of the above-described embodiment has the advantages described below.

Figure 11A:
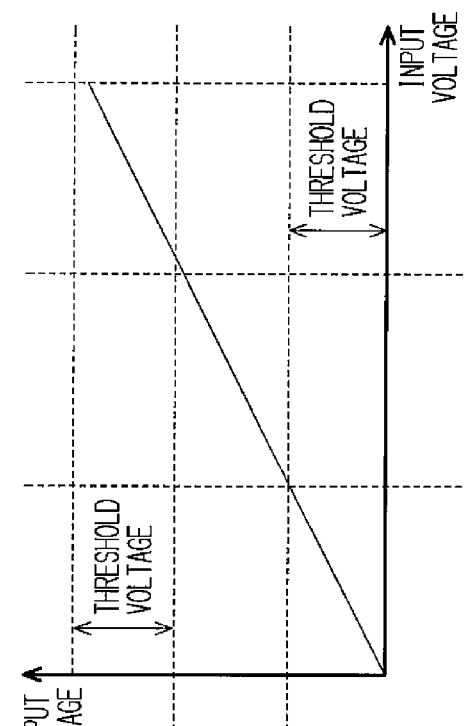
Figure 11C:
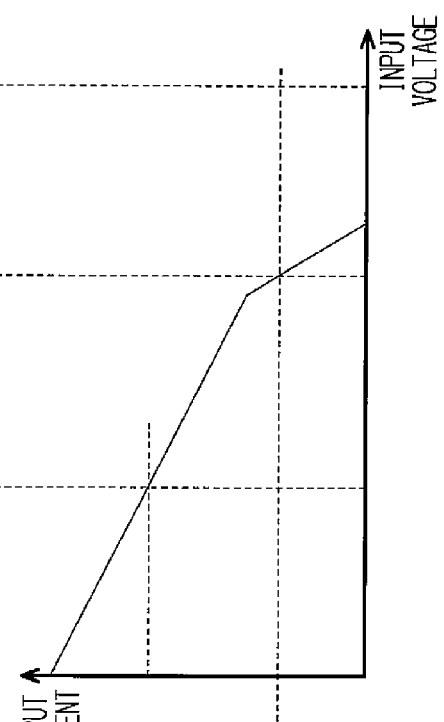
Figure 11B:
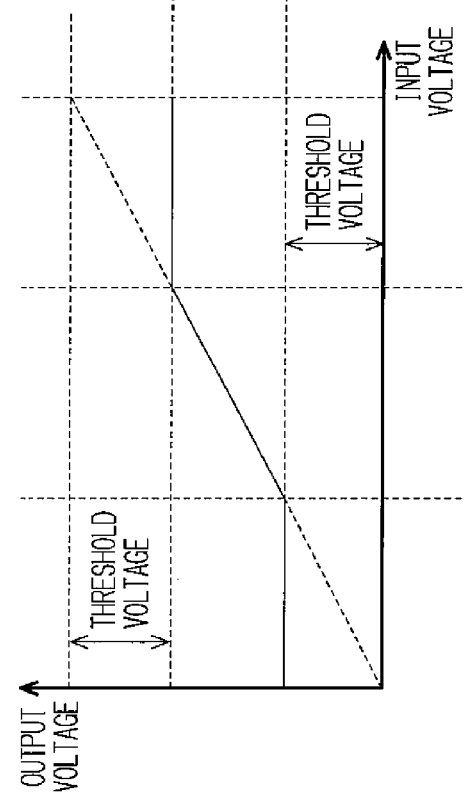
Figure 11D:
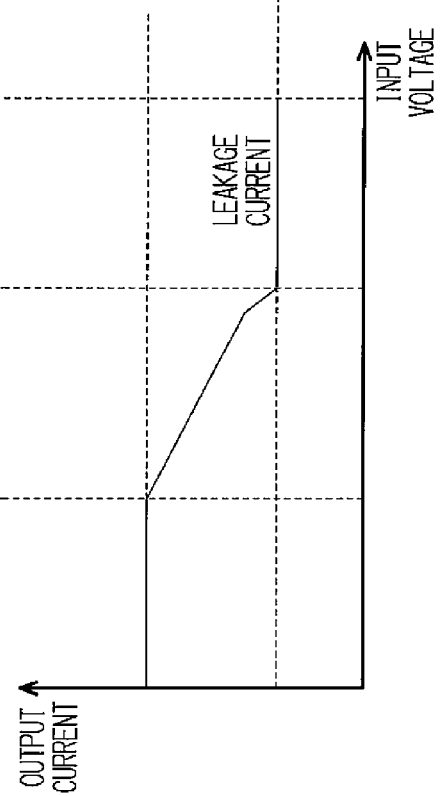

The transistor N4 operates in place of the transistor P2 in the low voltage range, and the transistor P4 operates in place of the transistor N2 in the high voltage range. In the buffer amplifier of the prior art, the output voltage is restricted by the input voltage due to the influence of the threshold voltage of the output transistor in the series regulator for the low voltage range and the high voltage range, as shown in FIG. 11A. As a result, the output current is restricted even if the input voltage is low, and leakage current is produced when the input voltage becomes high, as shown in FIG. 11B. In comparison, by using the transistors P4 and N4, the output voltage is fully swung with respect to the input voltage without being affected by the threshold voltage of the transistors P2 and N2, as shown in FIG. 11C. As a result, the maximum output current is increased, and leakage current is suppressed, as shown in FIG. 11D.

It should be apparent to those skilled in the art that the present invention may be embodied in many other specific forms without departing from the spirit or scope of the invention. Particularly, it should be understood that the present invention may be embodied in the following forms.

In the above-described embodiment, the buffer amplifier 20 is used in the series regulator. However, the application of the buffer amplifier 20 is not limited in any manner.

Figure 12:
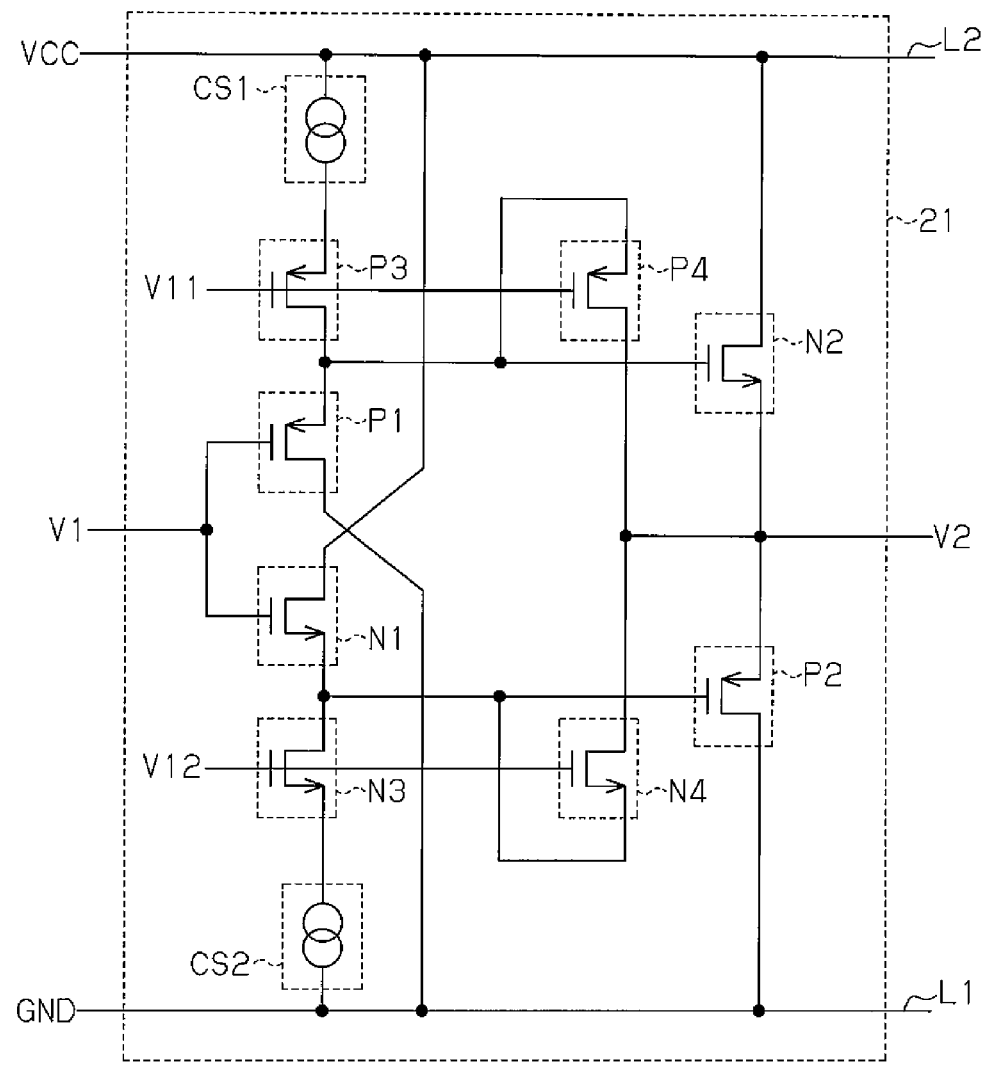
FIG. 12 is a circuit diagram of a buffer amplifier according to another embodiment of the present invention.

In the above-described embodiment, the current source CS1 is directly connected to the transistor P1, and the current source CS2 is directly connected to the transistor N1. Instead, as shown in FIG. 12, a buffer amplifier 21 may include a transistor P3, which is arranged between the current source CS1 and the transistor P1, and a transistor N3, which is arranged between the current source CS2 and the transistor N1. In this case, the transistor P1 is formed by a transistor element having a p-channel type MOS structure, and the transistor N1 is formed by a transistor element having an n-channel type MOS structure. The voltage V11 is input to the gate terminal of the transistor P3, and the voltage V12 is input to the gate terminal of the transistor N3. In this case, the first and the second source follower circuits include the transistors P3 and N3.

Figure 13:
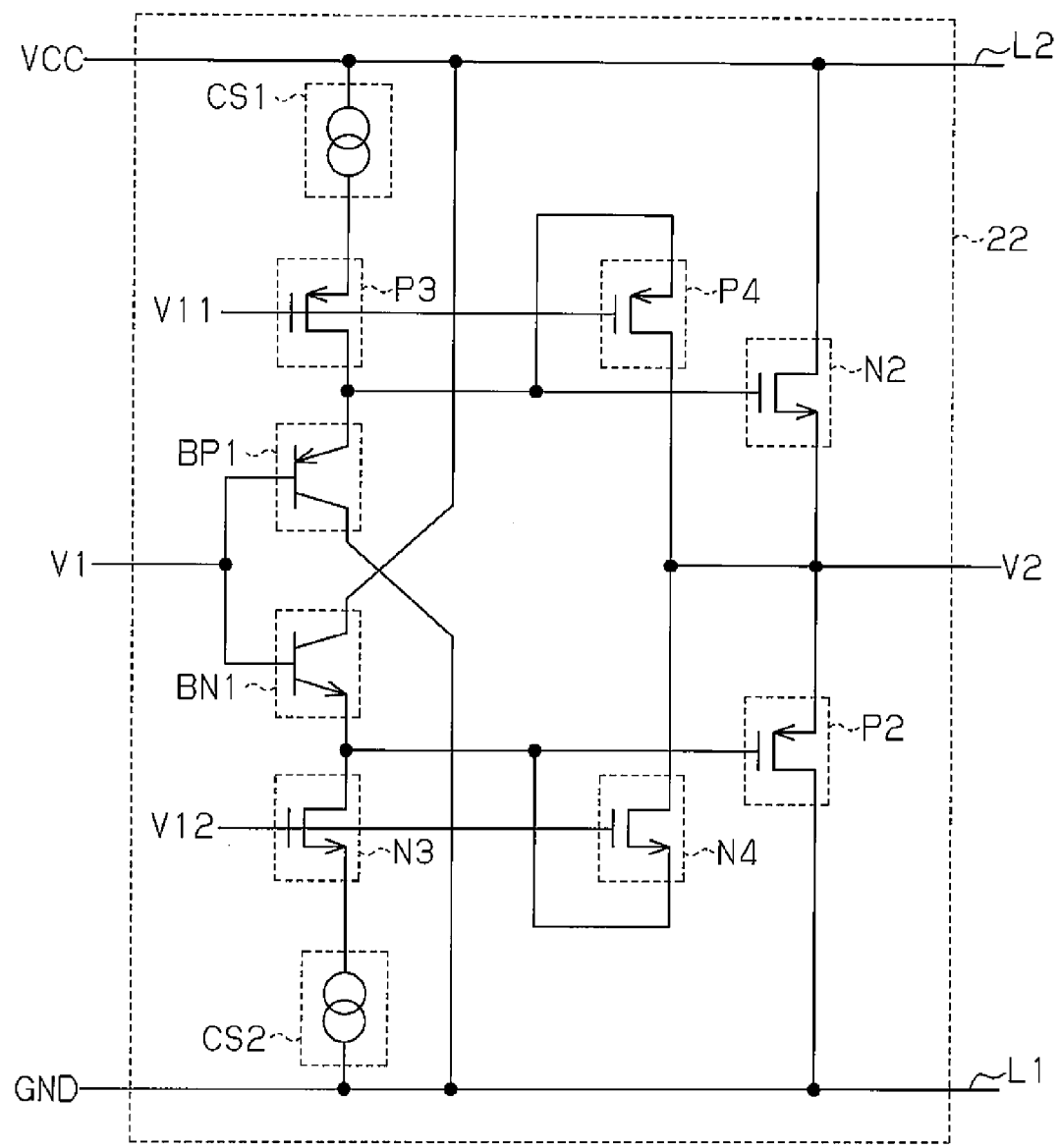
FIG. 13 is a circuit diagram of a buffer amplifier according to a further embodiment of the present invention.
Figure 14:
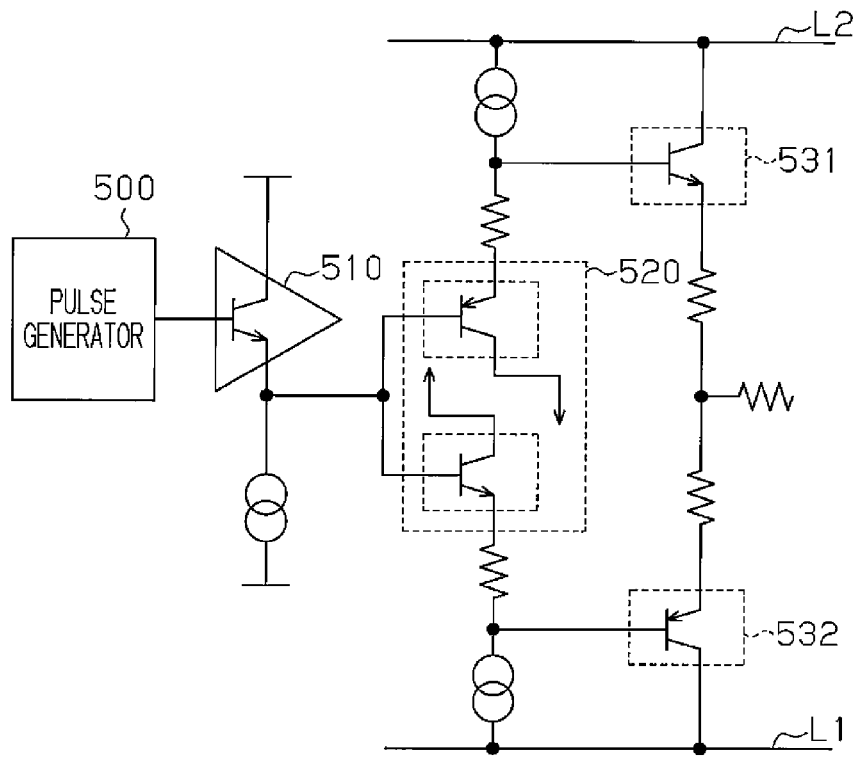
FIG. 14 is a circuit diagram of a prior art buffer amplifier.
Figure 15:
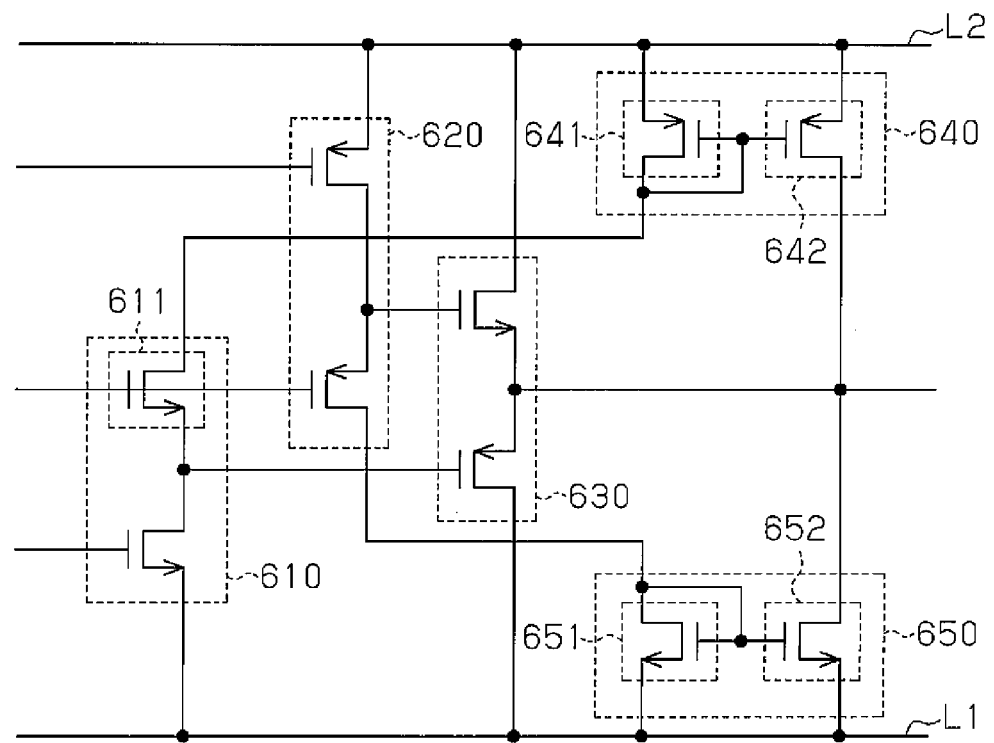
FIG. 15 is a circuit diagram of another prior art buffer amplifier.

In the above-described embodiment, the transistors P1 and N1 are formed by transistor element having a MOS structure. Instead, as shown in FIG. 13, a buffer amplifier 22 may include transistors BP1 and BN1, which are bipolar transistor elements. In this case, a pnp type transistor element is used as the transistor BP1, which serves as the first transistor, and an npn type transistor element is used as the transistor BN1, which serves as the second transistor.

The present examples and embodiments are to be considered as illustrative and not restrictive, and the invention is not to be limited to the details given herein, but may be modified within the scope and equivalence of the appended claims.

What is claimed is:

1. An amplifier circuit, comprising:
   first and second source follower circuits supplied with an input voltage;
   a first output transistor including a control terminal that receives an output of the first source follower circuit, and a first terminal, which is supplied with a power supply voltage;
   a second output transistor including a control terminal that receives an output of the second source follower circuit, and a first terminal, which is supplied with a base voltage;
   a first auxiliary transistor including a second terminal, which is connected to an output terminal of the first source follower circuit, and a control terminal, which receives a first bias voltage;
   a second auxiliary transistor including a second terminal, which is connected to an output terminal of the second source follower circuit, and a control terminal, which receives a second bias voltage; and
   an output means for outputting a voltage at a connection node of second terminals of the first and second output transistors and first terminals of the first and second auxiliary transistors.

2. The amplifier circuit according to claim 1, wherein:
   the first source follower circuit includes a first current source and a first transistor of a first conductance type; and
   the second source follower circuit includes a second current source and a second transistor of a second conductance type.

3. The amplifier circuit according to claim 2, wherein:
   the first auxiliary transistor is activated when the first transistor is deactivated by supplying the first bias voltage, which is set based on a value obtained by subtracting a threshold voltage of the first transistor from the power supply voltage; and
   the second auxiliary transistor is activated when the second transistor is deactivated by supplying the second bias voltage, which is set based on a value obtained by adding a threshold voltage of the second transistor to the base voltage.

4. The amplifier circuit according claim 2, wherein the first and the second transistors are each formed by a field-effect transistor element.

5. The amplifier circuit according claim 2, wherein the first and the second transistors are each formed by a bipolar transistor element.

6. An amplifier circuit for generating an output voltage, comprising:
   a first source follower circuit, connected between a power supply line and a ground line, having an input terminal that receives an input voltage;
   a second source follower circuit, connected between the power supply line and the ground line, having an input terminal that receives the input voltage;
   a first output transistor having a drain connected to the power supply line and a gate connected to an output terminal of the first source follower circuit;
   a second output transistor having a drain connected to the ground line and a gate connected to an output terminal of the second source follower circuit;
   a first auxiliary transistor having a source connected to the output terminal of the first source follower circuit, and a gate that receives a first bias voltage; and
   a second auxiliary transistor having a source connected to the output terminal of the second source follower circuit, and a gate that receives a second bias voltage, and wherein the output voltage is generated at a node connecting the sources of the first and second output transistors and the drains of the first and second auxiliary transistors.

7. The amplifier circuit of claim 6, wherein the first source follower circuit comprises a first current source and a first transistor connected to the first current source, and the second source follower circuit comprises a second current source and a second transistor connected to the second current source, wherein the gate terminals of the first and second transistors are connected together at the input terminals of the first and second source follower circuits.

8. The amplifier circuit of claim 7, wherein the first auxiliary transistor is activated when the first transistor is deactivated by supplying the first bias voltage at the gate of the first auxiliary transistor, wherein the first bias voltage is based on a value obtained by subtracting a threshold voltage of the first transistor from the power supply voltage; and the second auxiliary transistor is activated when the second transistor is deactivated by supplying the second bias voltage to the gate of the second auxiliary transistor, wherein the second bias voltage is based on a value obtained by adding a threshold voltage of the second transistor to the base voltage.

* * * * *